United States Patent [19]

Sulzbach

[11] Patent Number: 5,393,574

[45] Date of Patent: Feb. 28, 1995

[54] METHOD FOR FORMING LIGHT ABSORBING ALUMINUM NITRIDE FILMS BY ION BEAM DEPOSITION

[75] Inventor: Frank C. Sulzbach, Dallas, Tex.

[73] Assignee: Texas Instruments Incorporated, Dallas, Tex.

[21] Appl. No.: 144,367

[22] Filed: Nov. 2, 1993

Related U.S. Application Data

[62] Division of Ser. No. 937,254, Aug. 28, 1992.

[51] Int. Cl.$^6$ .............................................. B05D 3/06
[52] U.S. Cl. ...................... 427/530; 427/528; 427/523; 427/164; 427/165; 427/166; 427/419.1
[58] Field of Search ............ 427/530, 528, 523, 255.7, 427/419.1, 164, 165, 166; 428/310.5

[56] References Cited

U.S. PATENT DOCUMENTS 4,634,600  1/1987  Shimizu et al. ..................... 427/527

OTHER PUBLICATIONS

Ogata et al, "Properties of Aluminum Nitride Films by an Ion Beam and Vapor Deposition Method", Nucl. Instrum. Methods Phys. Res., Sect. B, B39(1-4) (1989) pp. 178-181.

Wang et al, "Composition and Structure of Titanium Nitride Films Prepared by Ion-Beam Enhanced Deposition," Nucl. Instrum. & Methods Phys. Res. 1991, V59, pp. 272-275.

*Primary Examiner*—Roy V. King
*Attorney, Agent, or Firm*—René E. Grossman; Richard L. Donaldson

[57] ABSTRACT

A light absorbing, low reflectance coating and method of fabricating the coating provided by electron beam evaporation of aluminum onto substrates bombarded with nitrogen ions to produce a randomly textured coating which traps light in a labyrinth. The coating is electrically insulating except for the first few tens of atoms which remain metallic. Absorptance exceeds 90% in the 0.4 to 16 $\mu$m region. The coating is flexible and can be deposited on a polymer base.

20 Claims, 1 Drawing Sheet

METHOD FOR FORMING LIGHT ABSORBING ALUMINUM NITRIDE FILMS BY ION BEAM DEPOSITION

This application is a division of application Ser. No. 07/937,254, filed Aug. 28, 1992.

BACKGROUND OF THE INVENTION

1. Field of the Invention

This invention relates to light absorbing, low reflectance coatings, primarily but not limited for use in light absorbing baffle coatings, solar energy collectors and photothermal devices in general.

2. Brief Description of the Prior Art

Infrared detectors and optical elements frequently require an opaque low reflecting (light absorbing) coating in several locations for proper operation. The coating should be as thin as possible but certainly less than 5 micrometers thick, transmit less than 0.1% and reflect less than 0.5% at wavelengths near 10 micrometers and preferably in the entire 8 to 14 micrometer range.

Opacity in the prior art has generally been defined to require a relatively thick layer (100 to 1000 atoms thick) of a metal having thereon a quarter wave length thick (in the wavelength region of interest) layer of a transparent dielectric and a thin semi-transparent layer thereover forming a resonating absorbing structure. The light paths established which are reflected from either the top or bottom of the quarter wave length thick layer destructively interfere with each other because the light reflected from the top of this layer is 180° out of phase with the light reflected from the bottom of this layer. This causes a cancellation or near cancellation of the reflected light to produce low reflectance. The addition of a further layer of dielectric material further reduces reflectance, improves the durability of the coating and increases the width of the low reflecting band. The thickness of quarter wave layer and the semi-transparent metal layer are altered to create a structure with an optical impedance which can be optimally antireflected by the further layer of dielectric material. All layers are preferably thin slabs of homogeneous material having densities approaching that of bulk material with mathematically sharp boundaries. The above described design for producing low reflectance in the visible spectrum was first published by Haas, Turner and Schroeder, *Journal of the Optical Society of America*, Volume 46, page 31 (1956).

The above described design was utilized using materials other than those described in the Haas et al. publication to provide low reflectance in the 0.5 to 3.0 micrometer range in about 1976. A design of the above general structure was described to the Air Force in 1979 using layers of titanium and aluminum oxide to produce low reflectance in the infrared region. Since 1985, yet another version of the above described design has been used to produce low reflectance at wavelengths near 10 $\mu$m with layers of titanium, germanium and zinc sulfide. A lift-off method is used for feature delineation.

The above described design for use near 10 $\mu$m relies upon the thin semitransparent metal layer having a thickness of about 15 nanometers. If the physical thickness varies by $\pm 1$ nanometer (about 4 atoms), the thickness of the fourth layer must usually be altered to bring the measured spectrum close to that intended. The region of very low reflectance is only about 1 $\mu$m wide. The reflectance increases as the angle of incidence changes from 0° (perpendicular to the surface) to any other angle, such as, for example, 45°. The above described design requires that the optical properties of the thin layer of reactive metal, titanium, be accurately known and reproduced exactly on a run-to-run basis to produce high yield. Slight changes in the deposition technique or residual atmosphere in the vacuum chamber alters the properties of the thin semi-transparent metal layer. This propensity, when combined with the thickness sensitivity, explains the relatively low probability of achieving the theoretically predicted response and accounts for "settling" for higher reflectance on a daily basis.

Spongy metal film structures are described by D. Slocum who utilized oblique evaporation of silver to make needle-like polarizing layers. Metal "soot" films have been produced by evaporating at higher pressure in non-reactive gases with substrates very close to the source. These films are easily rubbed or even blown off the substrates. W. Lang has described in *Journal of Vacuum Science Technology*, November/December 1990, evaporation of gold in nitrogen and aluminum in argon. Lang adds 20% oxygen to the argon while evaporating aluminum in a total pressure of 1.5 Torr. The density of these aluminum "soot films" is 250 $\mu$g/cc, or about 1/10,000 the density of bulk aluminum.

SUMMARY OF THE INVENTION

In accordance with the present invention, there is provided a light absorbing, low reflectance coating which minimizes the problems found in the prior art wherein a relatively thick, about 3 to about 5 micrometer, smooth layer of an absorbing material is overcoated with an antireflecting layer. An opaque metal underlayer may be added.

A rough, non-smooth, spongy absorbing film of $Al_xN_y$ is formed when evaporated aluminum is bombarded with nitrogen ions with a current density of from about 10 to about 300 $\mu$amperes/cm$^2$ and preferably about 70 $\mu$amperes/cm$^2$ and an acceleration voltage of from about 10 to about 1,000 eV and preferably about 70 eV., providing a light trapping labyrinth for visible and near infrared light wherein "y" is initially zero and continually increased relative to "x" until a "proper" or stoichiometric compound $Al_2N_3$ is reached. The vaporized aluminum is provided in an evacuated chamber having as low an initial pressure as possible, generally about $10^{-6}$ Torr initially. The pressure increases with the introduction of the energetic nitrogen ions up to about $3.5 \times 10^{-4}$ Torr, the pressure being maintained as low as possible so that the molecules can travel in the chamber efficiently with a minimum number of collisions. The novel structure is formed on the substrate of somewhat globular or specular elements with typical size of about 0.5 $\mu$m in diameter. The porous nature of the structure makes thickness measurement difficult. The average density of the $Al_xN_y$ is about 1 gm/cc, this being about one third the density of bulk aluminum nitride. The film absorbs nearly all 10 $\mu$m energy which is not reflected. There is very little scattering. The portion of the coating on the substrate and up to about 10 atoms above the substrate is pure aluminum with the amount of nitrogen combined with the aluminum gradually increasing thereafter until a stable form of aluminum nitride is formed, whereafter this stable form continues to be produced. It is therefore apparent that the aluminum portion of the coating is electrically conductive with the coating becoming increasingly electrically insulative as increased nitrogen becomes present. When the thickness of the $Al_xN_y$ is about 3 to 5 μm thick, the reflectance is very low from visible light (about 0.4 to about 0.7 μm) to about 10 μm. By increasing the thickness, the region of low reflectance extends to longer wavelengths in a nearly linear manner.

A dielectric overcoat layer reduces the reflectance in the 8 to 14 μm region. The dielectric overcoat layer is approximately ¼ wavelength thick optically at 10 μm and can be any semi-transparent material and is preferably amorphous carbon, however zinc sulfide, thorium tetrafluoride ($ThF_4$) and other possible materials can also be used. The amorphous carbon layer is formed by adding a gaseous hydrocarbon to the atmosphere after the oxygen and nitrogen have been purged from the system atmosphere and providing an RF discharge to decompose the hydrocarbon into carbon which is deposited over the $Al_xN_y$ and releases hydrogen. The pressure in the chamber increases several orders of magnitude due to entry of the hydrocarbon gas. The average absorptance exceeds 95% in the 8 to 14 μm region. Rubbing the film alters the visible appearance but the infrared reflectance changes very little. The film does not rub off or dissolve when placed in 100% hydrochloric acid.

Inclusion in the chamber of about 5% (i.e., raising the total pressure by 5% as a result of bleeding in pure $O_2$ using a needle valve or mass flow controller) oxygen and a total pressure of $4 \times 10^{-4}$ Torr has made the process more reproducible. Intentionally heating the substrate to about 100° C. to about 200° C. increases the size of the features and aids reproducibility and durability. The above described low reflectance coating can be deposited on flexible substrates such as 2 mil polyimide. The film does not crack or fall off under considerable flexure.

The $Al_xN_y$ film has almost no lateral electrical conductivity when probes merely touch the porous surface and do not extend into the interior thereof. Lateral thermal conductivity should also be very low. When probes push through the spongy film, the electrical conductivity increases dramatically, the first few atomic layer, possibly as many as a few tens of such layers, retaining metallic properties. The film has more than 99% absorptance in the solar energy region. If the film is placed on glass, the appearance when looking through the glass is shiny and mirror-like. When viewed from the coated side, the coating appears as a matte-black surface.

As a second embodiment, a smooth absorbing film of $Ti_xN_y$ is formed in the above described manner, but the optical properties produce a minimum of reflectance between 10 and 11 μm when overcoated with a low index of refraction layer, such as, for example thorium tetrafluoride ($ThF_4$).

DESCRIPTION OF THE PREFERRED EMBODIMENT

Figure 1:
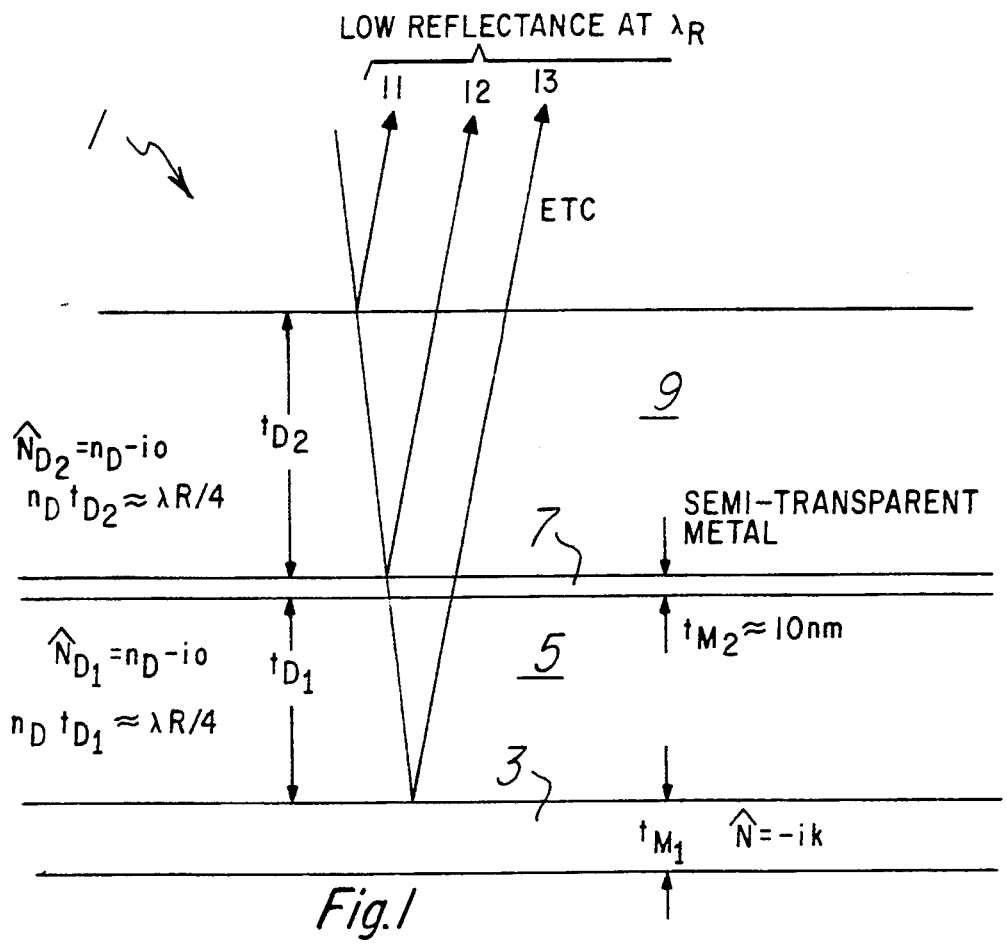
FIG. 1 is a schematic diagram of a prior art anti-reflective coating or film.

Referring first to FIG. 1, there is shown a prior art anti-reflective structure 1 which includes an opaque reflective layer 3, preferably of metal over which is a transparent dielectric layer 5 having a thickness which is one quarter wave length of the center frequency of the frequency range being received. A relatively thin semi-transparent layer 7, preferably of metal, is disposed over the transparent layer 5. An optional further dielectric layer 9 is disposed over the layer 7.

Light entering the anti-reflective structure 1 will be reflected from (a) the upper surface of the layer 9 to provide beam 11, (b) the upper surface of the semi-transparent layer 7 to provide the beam 12 and (c) the lower surface of the quarter wave layer 5. Further multiple reflections are omitted for clarity. The layer 7 is very thin and can be considered to be the top of layer 5 in practice. It can be seen that the beam 13 has traversed the layer 5 in both directions and is therefor a half wave length out of phase with the beam 12. Accordingly, these beams will cancel. If the intensity of beam 11 is very low compared to beams 12 and 13, than essentially all of the light impinging upon the structure 1 will be absorbed therein.

Figure 2:
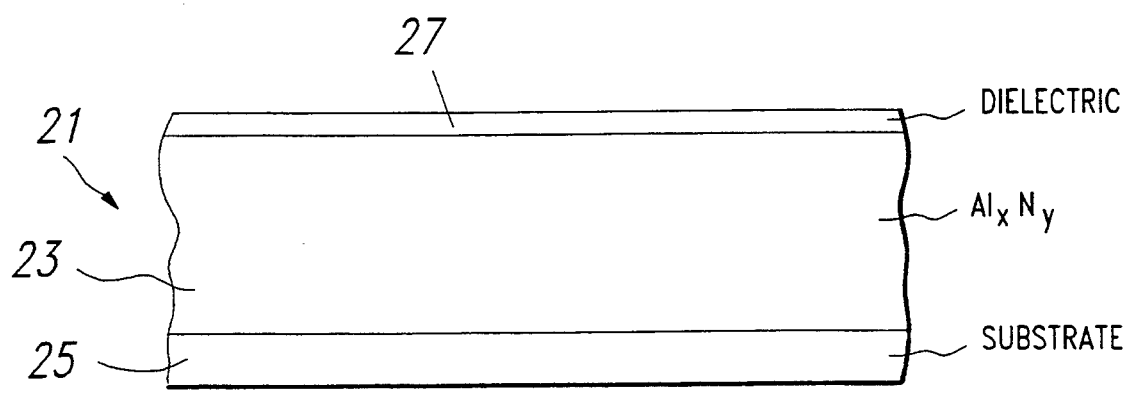
FIG. 2 is a schematic diagram of a coating or film in accordance with the present invention.

Referring now to FIG. 2, there is shown an anti-reflective structure 21 in accordance with a first embodiment of the present invention. A rough absorbing film of $Al_xN_y$ 23 about 4 micrometers thick is formed on a substrate 25 of rough sheet metal, it being understood that other materials, such as, for example, polished members, plastic, glass, germanium, etc. can be used as the substrate, by bombarding electron beam evaporated aluminum with nitrogen ions from a Kaufman-type source with a current density of about 70 μamperes/$cm^2$ at 70 eV within a chamber initially evacuated to about $10^{-6}$ Torr. The bombarding nitrogen ions raise the chamber pressure to about $3.5 \times 10^{-4}$ Torr. The distance from the electron beam gun to the substrate is 30 inches. The distance from the ion beam gun to the substrate is 20 inches. The film produced has minimum reflectance between 8 and 14 μm when overcoated with a low index of refraction layer, such as, for example, amorphous carbon, zinc sulfide or thorium tetrafluoride ($ThF_4$).

The portion of the layer 23 resting on the substrate 25 is pure aluminum for about the first ten atomic layers with the aluminum and nitrogen combining thereabove with continually increasing amounts of combined nitrogen to the top of the layer 23. The upper portions of the layer 23 are electrically insulating whereas the pure aluminum portion is electrically conducting. The electrical conductivity of layer 23 gradually decreases in a direction above the pure aluminum portion of the layer 23.

The dielectric overcoat layer 27 reduces the reflectance in the 8 to 14 μm region. The dielectric overcoat layer 27 is approximately ¼ wavelength thick optically and can be any semi-transparent material and is preferably amorphous carbon, zinc sulfide or thorium tetrafluoride ($ThF_4$). The amorphous carbon layer is formed by adding a gaseous hydrocarbon to the atmosphere after the oxygen and nitrogen have been purged from the system atmosphere. Introduction of the hydrocarbon raises the pressure in the chamber to about $> 5 \times 10^{-3}$ Torr and providing an RF discharge decomposes the hydrocarbon into amorphous carbon which is deposited over the $Al_xN_y$ and releases hydrogen. The aluminum is controlled by electrical input (2 to 3 kW) to an electron beam gun. The oxygen is controlled with a valve. If there is nay substantial amount of oxygen in the chamber while the hydrocarbon is present, the RF can cause a fire or explosion.

The evaporated aluminum can be replaced by evaporated titanium. In this case a smooth absorbing film of $Ti_xN_y$ is formed when electron beam evaporated titanium is bombarded with nitrogen ions from a Kaufman-type source. The bombarding nitrogen ions raise the chamber pressure to $3.5 \times 10^{-4}$ Torr. The distance from the electron beam gun to the substrate is 30 inches. The distance from the ion beam gun to the substrate is 20 inches. The optical properties produce a minimum of reflectance between 10 and 11 $\mu$m when overcoated with a low index of refraction layer, such as, for example thorium tetrafluoride ($ThF_4$).

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of fabricating a light absorbing film having an absorptance of about 95% in the 8 to 14 $\mu$m region, comprising the steps of:
   (a) providing an evacuated chamber;
   (b) placing a substrate in said chamber;
   (c) providing and depositing on said substrate vaporized elemental aluminum in said chamber; and
   (d) bombarding said vaporized elemental aluminum with nitrogen in progressively increasing amounts up to stoichiometry to deposit elemental aluminum on said substrate with aluminum nitride over said elemental aluminum having the formula $Al_xN_y$, where the atomic ratio of y:x is progressively increased.

2. The method of claim 1 further including the step of evacuating said chamber to a pressure of about $10^{-6}$ Torr prior to step (b).

3. The method of claim 1 further including the step of forming a semi-transparent dielectric layer over said aluminum nitride.

4. The method of claim 2 further including the step of forming a semi-transparent dielectric layer over said aluminum nitride.

5. The method of claim 1 wherein said substrate is one of globular or specular elements with size of about 0.5 micrometers in diameter.

6. The method of claim 2 wherein said substrate is one of globular or specular elements with size of about 0.5 micrometers in diameter.

7. The method of claim 3 wherein said substrate is one of globular or specular elements with size of about 0.5 micrometers in diameter.

8. The method of claim 4 wherein said substrate is one of globular or specular elements with size of about 0.5 micrometers in diameter.

9. The method of claim 1 wherein said step of bombarding includes bombarding said aluminum with nitrogen ions having a current density of from about 10 to about 300 $\mu$amperes/cm$^2$ and an acceleration voltage of from about 10 to about 1000 eV to form the deposited aluminum nitride.

10. The method of claim 9 wherein said deposited aluminum nitride is spongy and has an average density of about 1 gm/cc.

11. The method of claim 2 wherein said step of bombarding includes bombarding said aluminum with nitrogen ions having a current density of from about 10 to about 300 $\mu$amperes/cm$^2$ and an acceleration voltage of from about 10 to about 1000 eV to form the deposited aluminum nitride.

12. The method of claim 11 wherein said deposited aluminum nitride is spongy and has an average density of about 1 gm/cc.

13. The method of claim 3 wherein said step of bombarding includes bombarding said aluminum with nitrogen ions having a current density of from about 10 to about 300 $\mu$amperes/cm$^2$ and an acceleration voltage of from about 10 to about 1000 eV to form the deposited aluminum nitride.

14. The method of claim 13 wherein said deposited aluminum nitride is spongy and has an average density of about 1 gm/cc.

15. The method of claim 4 wherein said step of bombarding includes bombarding said aluminum with nitrogen ions having a current density of from about 10 to about 300 $\mu$amperes/cm$^2$ and an acceleration voltage of from about 10 to about 1000 eV to form the deposited aluminum nitride.

16. The method of claim 15 wherein said deposited aluminum nitride is spongy and has an average density of about 1 gm/cc.

17. The method of claim 5 wherein said step of bombarding includes bombarding said aluminum with nitrogen ions having a current density of from about 10 to about 300 $\mu$amperes/cm$^2$ and an acceleration voltage of from about 10 to about 1000 eV to form the deposited aluminum nitride.

18. The method of claim 17 wherein said deposited aluminum nitride is spongy and has an average density of about 1 gm/cc.

19. The method of claim 8 wherein said step of bombarding includes bombarding said aluminum with nitrogen ions having a current density of from about 10 to about 300 $\mu$amperes/cm$^2$ and an acceleration voltage of from about 10 to about 1000 eV to form the deposited aluminum nitride.

20. The method of claim 19 wherein said deposited aluminum nitride is spongy and has an average density of about 1 gm/cc.

* * * * *